US006825098B2

(12) United States Patent
Gabric et al.

(10) Patent No.: US 6,825,098 B2
(45) Date of Patent: Nov. 30, 2004

(54) METHOD FOR FABRICATING MICROSTRUCTURES AND ARRANGEMENT OF MICROSTRUCTURES

(75) Inventors: Zvonimir Gabric, Zorneding (DE); Werner Pamler, Munich (DE); Siegfried Schwarzl, Neubiberg (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/606,069

(22) Filed: Jun. 25, 2003

(65) Prior Publication Data

US 2004/0033652 A1 Feb. 19, 2004

(30) Foreign Application Priority Data

Jun. 25, 2002 (DE) ......................... 102 28 344

(51) Int. Cl.[7] .......................... H10L 21/30; H01L 21/46
(52) U.S. Cl. .................................................... 438/456
(58) Field of Search ........................... 438/456, 42, 43, 438/48, 455, 457, 680, 681, 692, 700, 704, 712, 734, 738

(56) References Cited

U.S. PATENT DOCUMENTS

| | | | |
|---|---|---|---|
| 5,821,014 A | 10/1998 | Chen et al. | |
| 5,869,880 A | 2/1999 | Grill et al. | |
| 5,936,295 A | 8/1999 | Havemann et al. | |
| 6,083,275 A | 7/2000 | Heng et al. | |
| 6,130,109 A | * 10/2000 | Jerominek et al. | ............ 438/53 |
| 6,201,243 B1 | * 3/2001 | Jerominek | ............... 250/338.1 |
| 6,252,290 B1 | 6/2001 | Quek et al. | |
| 6,277,728 B1 | 8/2001 | Ahn et al. | |
| 6,297,125 B1 | 10/2001 | Nag et al. | |
| 6,527,667 B2 | * 3/2003 | Oshidari et al. | ............. 476/40 |
| 6,612,917 B2 | * 9/2003 | Bruxvoort | ................. 451/533 |
| 6,717,060 B2 | * 4/2004 | Kragl et al. | ................ 174/255 |
| 2001/0002732 A1 | 6/2001 | Schwarzl et al. | |

FOREIGN PATENT DOCUMENTS

| | | |
|---|---|---|
| DE | 199 57 302 | 5/2001 |
| DE | 101 09 778 | 9/2002 |
| EP | 1 152 463 | 11/2001 |

OTHER PUBLICATIONS

M.T. Bohr, "Interconnect Scaling—The Real Limiter to High Performance ULSI", *IEDM 95*, pp. 241–244.
S. Oh and K. Chang, "2001 Needs for Multi–Level Interconnect Technology", *Circuits & Devices*, Jan. 1995, pp. 16–20.
T.H. Ning, "0.1 μm Technology and BEOL", *Mat. Res. Soc. Symp. Proc.*, vol. 427, 1996, pp. 17–21.
K. Yamashita & S. Odanaka, "Interconnect Scaling Scenario using a Chip Level Interconnect Model", *Symp. On VLSI Technology Digest of Technical Papers*, 1997, pp. 53–54.
Ueda et al, "A Novel Air Gap Integration Scheme for Multi–Level Interconnects Using Self–Aligned Via Plugs", *1998 Symposium on VLSI Technology Digest of Technical Papers*, pp 46, 47.

* cited by examiner

*Primary Examiner*—David Nhu
(74) *Attorney, Agent, or Firm*—Schiff Hardin LLP

(57) ABSTRACT

A method referred to as a "cellular damascene method" utilizes a multiplicity of regularly arranged closed cavities referred to as "cells", which are produced in a patterning layer. The dimensions of the cavities are on the order of magnitude of the microstructures to be produced. Selected cavities are opened by providing a mask and partitions situated between adjacent opened cavities are removed to provide trenches and holes which are filled with the material of the microstructure to be fabricated. Protruding material is removed by means of a chemical-mechanical polishing step. The microstructures are, in particular, interconnects and contact holes of integrated circuit.

16 Claims, 5 Drawing Sheets

METHOD FOR FABRICATING MICROSTRUCTURES AND ARRANGEMENT OF MICROSTRUCTURES

BACKGROUND OF THE INVENTION

The invention is in the field of semiconductor technology and relates to a method for fabricating microstructures.

Advancing scaling of integrated circuits and the associated miniaturization and increasing complexity of the structures contained in the integrated circuits entail a multiplicity of problems.

Thus, by way of example, the interconnect resistances of the individual interconnects within the wiring planes increase. The capacitive coupling between the interconnects increases at the same time. Associated with this is an unfavorable rise in the RC time constants, which lead to rising signal propagation times, decreasing limiting frequencies, high power loss densities and crosstalk effects. The technical literature also groups these problems under the term "wiring crisis". In this respect, see, in particular, the technical articles by M. T. Bohr, "Interconnect Scaling—The Real Limiter to High Performance ULSI", *IEDM 95*, pages 241–244; S. Oh and K. Chang, "2001 Needs for Multi-Level Interconnect Technology", *Circuits & Devices*, January 1995, pages 16–20; T. H. Ning, "0.1 µm Technology and BEOL", *Mat. Res. Soc. Symp. Proc.*, Vol. 427, 1996, pages 17–21; and K. Yamashita & S. Odanaka, "Interconnect Scaling Scenario using a Chip Level Interconnect Model", *Symp. On VLSI Technology Digest of Technical Papers*, 1997, pages 53–54.

A further problem associated with miniaturization can be examined in the proximity effects of lithography (e.g. U.S. Pat. No. 5,821,014, whose disclosure is incorporated herein by reference thereto) and etching technology. In the fabrication of integrated circuits, these effects lead to structural results which deviate from the desired structures prescribed on the lithography mask. In order to reduce or eliminate the proximity effects, it is necessary to resort to corrections (for example layout changes, U.S. Pat. No. 6,083,275, whose disclosure is incorporated herein by reference thereto) of ever increasing complexity. The effects discussed are based on the fact that individual process steps of the overall patterning process (exposure, development, plasma etchings, chemical mechanical polishing, etc.) depend on the local structural characteristic features (packing density, distances from adjacent structures, center and edge positions). The required layout changes have to be determined for each new layout, with a high outlay, and taken into account by means of suitable measures on the corresponding masks.

In order to reduce the RC time constants, use is often made of interconnects having high conductivity (e.g. copper) and dielectrics having low dielectric constants $\in_r$ (often also designated by k). Diverse organic dielectrics having dielectric constants of approximately 2:5 are used as "low-k dielectrics" (e.g. so-called aerogels or xerogels, U.S. Pat. No. 6,277,728, whose disclosure is incorporated herein by reference thereto), but they are usually associated with diverse disadvantages (low thermal and chemical stability, hygroscopy, low blocking effect against the diffusion of e.g. copper, need to develop new deposition and patterning processes, new process installations). Porous inorganic dielectrics having even lower dielectric constants (e.g. porous SiON) are not yet ready for production at the present time.

The best material with extremely low $\in_r$ is a vacuum or air ($\in_r=1$). Therefore, a series of documents deal with techniques enabling the production of cavities between interconnects.

Thus, in accordance with U.S. Pat. No. 6,252,290 B1, whose disclosure is incorporated herein by reference thereto, by way of example, after the completion of the interconnects, cavities are produced between the interconnects by subsequent removal of insulation material.

U.S. Pat. No. 5,936,295, whose disclosure is incorporated herein by reference thereto, by contrast, exploits the porosity of a dielectric layer. After the completion of interconnect sections between which an auxiliary material is situated, the dielectric layer is applied to the interconnect sections and the auxiliary material. On account of the porosity of the dielectric layer, an etching substance can penetrate as far as the auxiliary material and remove the latter. As a result, cavities remain between the interconnect sections.

A similar approach is pursued by U.S. Pat. No. 6,297,125 B1, whose disclosure is incorporated herein by reference thereto, but here a dielectric covering layer with subsequently introduced slots is used, through which the etching substance can penetrate as far as the auxiliary material.

In contrast thereto, in accordance with U.S. Pat. No. 5,869,880, whose disclosure is incorporated herein by reference thereto, in each patterning plane (metallization and contact hole plane), the initially solid dielectric between the metal structures is finally patterned, thereby forming comparatively small openings in the dielectric in comparison with the metal structures, which openings contribute to a reduction of the dielectric constants taking effect.

An additional method for forming cavities between metal structures is disclosed in United States Patent Application Publication No. US 2001/0002732A1, whose disclosure is incorporated herein by reference thereto and which claims priority from DE 199 57 302 A1, wherein the cavities can be produced in a self-aligned manner with respect to the metal structures.

The above-mentioned methods have the disadvantage of a relatively high process complexity. Despite the cavities, capacitive couplings occur between the interconnects of different metallization planes on account of the dielectric layers (e.g. silicon oxide or silicon nitride) situated there. One possibility of reducing these capacitive couplings is afforded by the production of macroscopic cavity arrangements in these dielectric layers, i.e. in the contact hole plane, as is described for example in the German patent application DE 101 09 778.6 from the same applicant and in previously-cited U.S. Pat. No. 5,869,880.

However, the fundamental problems going back to the proximity effects of lithography and etching technology are not avoided with the abovementioned methods.

SUMMARY OF THE INVENTION

Therefore, it is an object of the present invention to specify a method in which the effects of proximity effects are considerably reduced.

This object is achieved by means of a method for fabricating microstructures comprises the following steps:

a) forming of a regular arrangement of closed cavities in a patterning layer arranged on a substrate, the cavities being separated from one another by partitions;

b) opening of selected cavities in which microstructures are intended to be produced;

c) removal of at least a portion of the partitions situated between adjacent opened cavities in order to form trenches extending over at least two cavities; and d) introduction of a material into the trenches in order to fabricate the microstructures.

Accordingly, in accordance with the invention, firstly a regular arrangement of closed cavities is formed in a patterning layer. Regular structures can be fabricated with particularly high precision and accuracy in conjunction with a comparatively small extent. On account of the regularity, no local differences occur during the exposure and the etching. Therefore, local proximity effects are avoided particularly during a global regular patterning of the patterning layer. On the other hand, the regularity of the cavities also allows the imaging of cavities which are so small that they can no longer be imaged satisfactorily in the case of separate imaging. The individual cavities are separated from one another by partitions comprising the material of the patterning layer.

In order to reliably ensure the regularity, the closed cavities are formed by microelectronic processes known per se (e.g. CVD, lithography, etching, CMP). It is preferably the case, therefore, that in order to form the cavities, depressions are produced in the patterning layer and are closed with a covering layer, thereby producing the cavities. In this case, the dimensions of the depressions or the cavities are of the order of magnitude of the microstructures to be produced. In particular, the minimum lateral extent of the microstructures to be produced is determined by the extent of the cavities.

Preferably, the cavities or the depressions etched into the patterning layer in order to form the cavities are defined lithographically and subsequently etched into the pattering layer. In this case, a resist mask may preferably be used for the lithographic definition of the cavities or the depressions, at least two regular strip patterns rotated through a predetermined angle relative to one another being successively imaged into said resist mask. In contrast to raster-shaped patterns, strip patterns can even be imaged with higher accuracy in conjunction with the same resolution. On the other hand, they also enable the imaging of more closely adjacent lines than is possible in the case of a raster-shaped pattern. The possibilities of lithography can be maximally utilized by means of the imaging of strip patterns.

During the imaging of regular strip patterns, at least two exposures are required, the strip pattern being rotated through a predetermined angle, e.g. 90°, between the individual exposures. In principle, it is also possible to image different (e.g. with a different line spacing) strip patterns rotated with respect to one another, in order, for example, to produce cavities that are rectangular in cross section.

It is favorable if,
in order to form the patterning layer, at least a first and a second layer are successively applied to the substrate, the materials of the first and second layers being chosen so as to enable a deposition of the material of the covering layer on the second layer selectively with respect to the first layer,
in order to form the cavities, the depressions are formed in the first and second layers, the depressions penetrating through the second layer completely and penetrating through the first layer at least partially, and, afterward, the material of the covering layer is deposited in such a way that it grows essentially only on the second layer, since this enables the covering layer to be applied in a particularly simple and purposeful manner. Moreover, inadvertent filling of the depressions is reliably avoided. Accordingly, the materials for the first and second layers are selected so as to ensure a selective deposition of the covering layer on the second layer. The depressions are formed completely in the second layer and at least partly in the first layer. Preferably, the first layer is likewise etched through completely. The residual material between the depressions forms the partitions.

A third layer may be applied in addition to the first and second layers, the material of which third layer differs from the second layer, so that the material of the covering layer essentially likewise grows only on the second layer. Accordingly, no material of the covering layer grows on the first and third layers, even if, during the progressive growth of the material of the covering layer on the second layer, the third layer is possibly covered by said material. In the case of a three-layered construction of the patterning layer, the third layer preferably serves as a polishing stop during the subsequent polishing-back of the protruding material of the covering layer. In the case of a two-layered construction, by contrast, the second layer preferably performs this function.

The first, second and third layers are preferably dielectric layers, since, for dielectric layers, it is possible to have recourse to a multiplicity of suitable and proven patterning methods, in particular anisotropic plasma etching methods.

The use of silicon nitride for the first and third layers is particularly favorable. By contrast, a silane-based silicon oxide deposited in plasma-enhanced fashion is preferably used for the second layer. Given this choice of materials for the first, second and third layers, an oxide can be deposited selectively on the second layer by means of $O_3$/TEOS deposition. Therefore, an oxide of this type is preferably used for the covering layer.

In order to reliably ensure the formation of the cavities, the first layer is preferably made about 4 to 5 times thicker than the second layer.

Afterward, those cavities in which the microstructures to be fabricated are intended to be formed are opened at their top side preferably by methods of lithography and etching technology. To that end, a mask (photomask/resist mask) is applied to the covering layer, leaving uncovered the cavities that are to be opened. The material of the covering layer is expediently etched selectively with respect to the material of the first, second and third layers, and the material of the mask. As a result, even in the event of a possible misalignment of this mask with regard to the cavities, the side walls of the cavities are not etched, so that the position and extent of the cavities are preserved. The mask (for example the strip masks) used for forming the cavities (or the depressions) is, accordingly, the actual patterning mask, whereas the mask for opening the cavities performs the function of a selection mask. Therefore, less stringent requirements can be made of the mask for opening the cavities than of the mask for defining the cavities.

At least a portion of the microstructures is intended to extend over a plurality of opened cavities. This requires the removal of the webs or partitions of the patterning layer which are situated between the opened cavities. In this case, recourse is preferably had to the same mask (selection mask) which has already been used for opening the closed cavities. Through the removal of the webs or the partitions, adjacent cavities that are initially separated from one another are combined to form individual trenches running in the patterning layer. The fabrication of the microstructures is concluded by filling the opened cavities or the trenches with the material of the microstructures to be fabricated and, if appropriate, polishing-back (for example by means of CMP) the filling material.

It lies within the scope of the invention to fabricate by the method according to the invention exclusively those microstructures which extend over at least two cavities, and, in addition thereto, to fabricate those microstructures which only fill individual opened cavities. In the latter case, in addition to the trenches, individual opened cavities are also filled with the material of microstructures in order to form said microstructures.

The cavities have a lateral extent prescribed in particular by the lithography used (masks). In this case, in the context of the invention, lateral extent is understood to mean that which extends in the plane of the patterning layer. In the simplest case, the cavities have a square or approximately square cross section in a plan view of the patterning layer, deviations from the square cross section being caused in particular as a result of the imperfection during the lithographic imaging. If the microstructures to be fabricated are formed in a trench encompassing two adjacent cavities, their lateral extent at least in one direction amounts to at least twice the lateral extent of the cavities in this direction.

The method according to the invention may also be referred to as a "cellular damascene method". The basic concept is fabricating the microstructures by selecting individual cavities and, if appropriate, combining a plurality of cavities. Each cavity forms one cell in this case. In this case, the arrangement and the course of the microstructures to be fabricated depend on the raster-shaped arrangement of the cells. The latter may be made square, for example, and be arranged in rows and lines. Other arrangements are likewise possible.

The microstructures to be fabricated can ultimately be any desired microstructures, i.e. both microelectronic and micromechanical structures. The type of microstructures to be fabricated also decides the material with which the uncovered cavities or the trenches are filled. The material may be e.g. metals, insulators, semiconductors, ferroelectrics etc. The fabrication of interconnects is particularly preferred, so that the material to be introduced is, in particular, metals and/or metal alloys, and preferably copper.

The method according to the invention also at the same time alleviates the problem of capacitive coupling in particular between interconnects, since, through selection of the cavities to be opened, the interconnects can be placed so that closed cavities remain between adjacent interconnects. Since the dielectric constant $\in_r$ of said cavities amounts to 1, the dielectric constants taking effect between the adjacent interconnects is correspondingly reduced.

The advantages that can be achieved with the method according to the invention can be summarized in particular as follows:

The regular arrangement of the cavities gives rise to microstructures which do not depend on proximity effects. The line widths and lengths are equal to the cell width or a multiple thereof if appropriate plus the web width.

Steepness and accuracy of the microstructures are determined, independently of the material to be introduced, essentially by the cavity side walls, that is to say primarily by patterning methods used to form the depressions or cavities, in particular tried and tested anisotropic plasma etchings of dielectrics (silicon oxide, silicon nitride). The side walls can therefore be steep and smooth for all materials of the microstructures to be fabricated.

The distance between the microstructures is determined by the web width of the cells alone or by the web width and the cavity width.

Complex proximity corrections are obviated owing to the regular arrangement of the cells. Length and width of the resulting microstructures are an integer multiple of the cell size plus the width of the partitions originally situated between the combined cells. If the cells are rectangular, the length and the width of the microstructures in each case amount to the integer multiple of the lateral extent of the cells in the corresponding direction.

Cavities between the interconnects make it possible to reduce the capacitive couplings between the interconnects and thus generally capacitive couplings and signal delays.

It is possible to have recourse to all the advantages of the damascene method, e.g. patterning of materials that cannot be etched or are difficult to etch.

The size of the microstructures is preferably in the micrometers range, i.e. 1–1000 μm, or less (<1 μm). The method is preferably used in the fabrication of integrated circuits.

The invention furthermore relates to an arrangement of microstructures having a patterning layer in which a multiplicity of closed cavities and a multiplicity of microstructures are arranged, the closed cavities being seated on grid points of a predetermined raster and the microstructures running along the connecting lines that connect the grid points, and the closed cavities having a given lateral extent in at least one direction and the lateral extent of the microstructures in this direction corresponding to at least twice the lateral extent of the cavities.

In the arrangement according to the invention, the orientation and the position of the individual microstructures are prescribed by the raster of the cavities. Wherever microstructures are situated, there were originally cavities present. Combining at least two adjacent cavities, i.e. removing the partitions or webs situated between the cavities, has resulted in a continuous trench filled with the material of the microstructures. The partitions running between adjacent cavities and between cavities and microstructures adjacent thereto preferably have the same thickness, the partitions running parallel to the connecting lines and in a manner offset uniformly with respect thereto.

The closed cavities preferably have a given lateral extent, so that the length of the microstructures corresponds to at least twice the extent of the cavities, if appropriate plus the width of the partition originally present between the adjacent cavities. The minimum extent of the microstructures preferably corresponds to the extent of the cavities.

It is furthermore preferred for the grid points to have a distance D along a first direction and the closed cavities to have a lateral extent B along said direction, where the length of the microstructures is n·D+B and n is natural number (n>0). If n=1, by way of example, the microstructure extends over two adjacent cavities. It lies within the scope of the invention that the grid points may have a different distance $D_1$ and $D_2$ and a different lateral extent $B_1$ and $B_2$ in a different direction, e.g. perpendicularly to one another. This may be the case e.g. with cavities having a rectangular cross section in a plan view of the patterning layer. The microstructures then have an extent of n·$D_1$+$B_1$ and m·$D_2$+$B_2$ in the respective direction, where m and n are natural numbers and at least one of these two numbers is greater than 0. By way of example, it may be that m=0, and n>0. In this case, the width of the microstructures corresponds to the lateral extent $B_2$ and the length corresponds to a multiple of $D_1$ plus $B_1$. The microstructures can assume practically any desired form within the raster prescribed by the cavities. Strip-shaped, areas and angular forms shall be mentioned here as examples. The cavities preferably have a square cross section in a plan view of the patterning layer, so that $D_1$=$D_2$=D and $B_1$=$B_2$=B hold true.

Preferably, the patterning layer comprises at least a first and a second layer made of different material, said second layer lying on said first layer, and the cavities run at least in the first layer and the microstructures run at least in both layers. A covering layer closing the cavities is preferably arranged in the plane of the second layer, so that the cavities essentially extend below the second layer, i.e. essentially within the first layer. By contrast, the microstructures preferably penetrated through both the first and the second layer, and preferably terminate with the upper edge of the second layer. If the patterning layer is even provided with at least three layers, the microstructures extend over all three layers. The cavities can be formed completely or only partly in the first layer, i.e. they did not completely penetrate through the first layer on the side remote from the second layer.

Preferably, the material of the first layer is silicon nitride and the material of the second layer is silicon oxide. The microstructures preferably constitute interconnects, in which case they comprise, in particular, a metal or a metal alloy, and preferably copper.

The covering layer closing the cavities is preferably grown selectively on the material of the second layer.

The arrangement according to the invention preferably involves microstructures and in particular interconnects of an integrated circuit.

The invention is described below on the basis of exemplary embodiments and is illustrated in the Figures.

BRIEF DESCRIPTION OF THE DRAWINGS

FIGS. 1A–1I' show individual fabrication steps of one exemplary embodiment of the method according to the invention;

DESCRIPTION OF THE PREFERRED EMBODIMENTS

FIGS. 1A–1I' show an embodiment of the "cellular damascene method", in which the microstructures to be fabricated are separated from one another by cavities. The cavity pattern produced in this case extends over the entire surface of a chip to be fabricated or at least over the majority of its area.

Figure 1A:
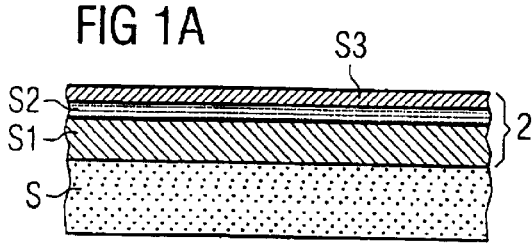

FIG. 1A is a cross-sectional view that shows a substrate S, on which three dielectric layers S1, S2 and S3 have been successively deposited. At least the material of the second layer S2 differs from the material of the first layer S1 and of the third layer S3. By way of example, the first and third layers S1 and S3 may comprise silicon nitride and the second layer S2 may comprise silicon oxide which has been formed by means of a plasma-enhanced deposition from a silane atmosphere. In this case, the first layer S1 performs the function of a carrier layer and defines the height of the cavities that are subsequently to be formed. For this reason, this layer has a thickness that is about 4 to 5 times higher or larger than the second layer S2, for example. The latter serves as carrier material on which the covering layer for closing the cavities subsequently grows selectively. In order to ensure the selectivity during the deposition of the material of the covering layer, the materials of the layers S1 to S3 must be chosen accordingly. The third layer S3 in turn serves as a polishing stop for a polishing step that is subsequently to be carried out. The entire thickness of this multilayer approximately corresponds to the desired height of the microstructures to be produced. The three layers S1 to S3 together form the patterning layer 2.

Lithography and etching, which uses a resist mask (not shown) are carried out to produce a grid pattern, grid web or partition 4 for forming the depressions 6 in the patterning layer 2. The width of the grid webs or the partitions 4 is chosen to be as small as possible, with a lower limiting factor being the required mechanical stability for the subsequent process steps. The accuracy with which the mask for opening the cavities and removing the partitions can be aligned with respect to the cavity raster is also a limiting factor. By way of example, the overlay accuracy currently achieved in mass production is about 15 nm. It is expected that this accuracy will be improved in the future. The width of the partitions should therefore be greater than the overlay accuracy that can respectively be achieved.

All lithography methods, e.g. optical lithography, electron or ion beam projection lithography or EUV lithography, can be used for fabricating the depressions 6. For the case where one of the lithography methods would not produce depressions with sharp angles owing to inadequate resolution, two regular strip patterns rotated through 90 degrees relative to one another can be successively imaged into the resist mask. The exposure with two strip patterns rotated through 90° with respect to one another is illustrated in more detail in connection with FIG. 4.

Figure 1B:
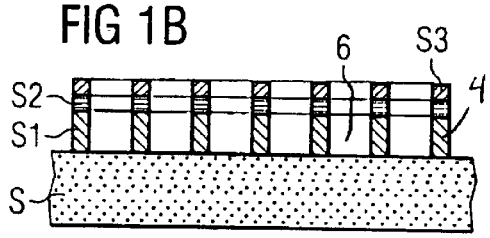
Figure 1B:
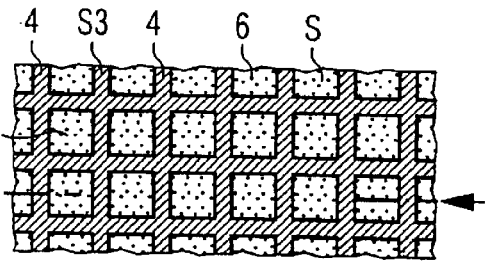

The plan view of the structure thus obtained is shown in FIG. 1B' and the associated cross section along the line identified by an arrow is shown in FIG. 1B. In all the subsequent illustrations of FIG. 1, the illustrations respectively identified by an apostrophe (') show the plan view, while the associated illustrations without an apostrophe show the cross section along the line indicated by the arrows.

In a next method step, the material of the covering layer S4 is deposited selectively on the second layer S2. Owing to the selectivity of this deposition, the material of the covering layer S4 grows neither on the first layer S1 nor on the third layer S3. The time duration for this deposition is chosen so that the depressions 6 are reliably closed by lateral growth of the material of the covering layer S4, so that terminated cavities H are produced and the upper edge of the deposited covering layer S4 at least reaches the upper edge of the third layer S3. An intermediate stage of the deposition of the covering layer S4 with depressions that have already been partly closed is shown in FIGS. 1C1 and 1C1', while the end stage is shown in FIGS. 1C2 and 1C2'. The cavities H thus produced form the individual cells which determine the extent and the course of the microstructures to be fabricated. The regular arrangement of the cavities H defines a grid at whose grid points the cavities are arranged. The microstructures that are subsequently to be formed in the cavities are therefore likewise oriented to this grid and run along the connecting lines that connect the grid points.

In the case of the materials specified above for the layers S1 to S3, the material chosen for the covering layer S4 is silicon oxide, which grows only on the second layer S2 as a result of an ozone-enhanced TEOS (tetraethyl orthosilicate) deposition.

Figure 1D:
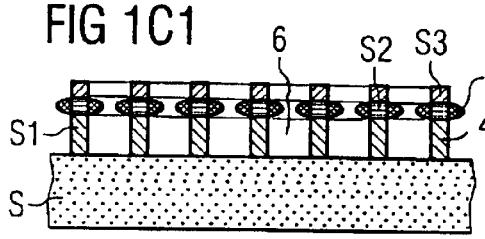
Figure 1D:
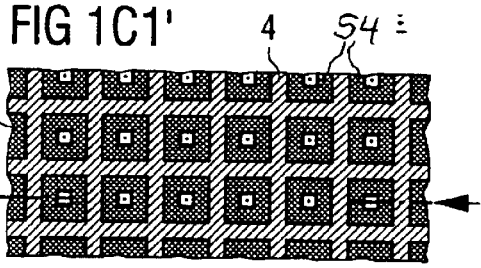
Figure 1D:
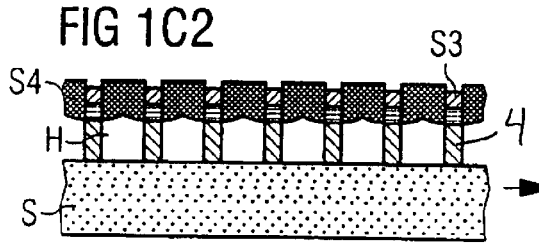
Figure 1D:
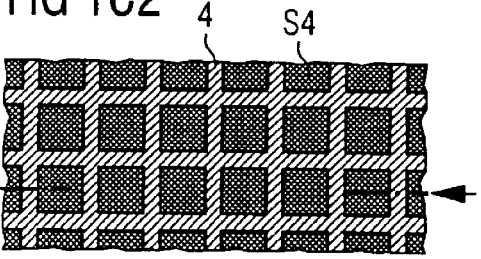
Figure 1D:
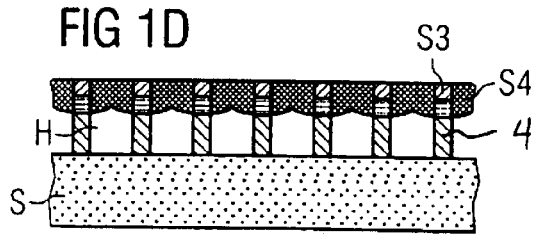

The material of the covering layer S4 which projects above the third layer S3 is removed by means of chemical mechanical polishing (CMP), and it is possible to set the CMP step in such a way that it stops reliably on the third layer S3, as shown in FIG. 1D.

Figure 1E:
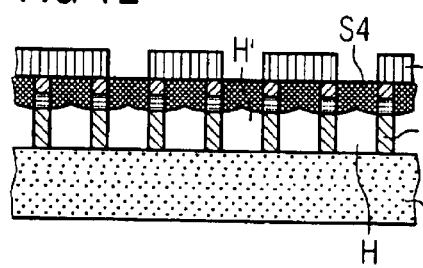
Figure 1E:
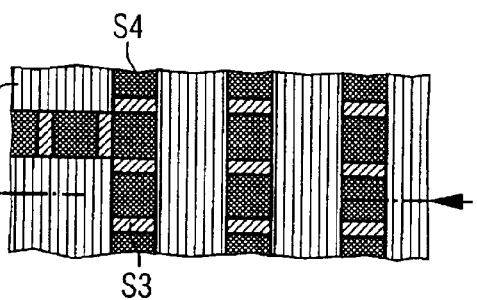

An additional lithography step defines those cavities H' which are intended to be opened by means of a subsequent etching step. To that end, a resist mask PR is applied to the polished surface of the covering layer S4 and of the third layer S3, is exposed and is developed. This method stage is shown in FIGS. 1E and 1E'. During the exposure of the resist mask PR, it should be taken into consideration that the width and length of the openings to be formed in the resist mask PR are chosen so that the latter, with the inclusion of the overlay alignment accuracy, do not project beyond the partitions 4 delimiting the individual cavities H, H'. However, they can also be chosen to be smaller as long as the conformity of the subsequent deposition process for filling the opened cavities H' is ensured.

Figure 1F:
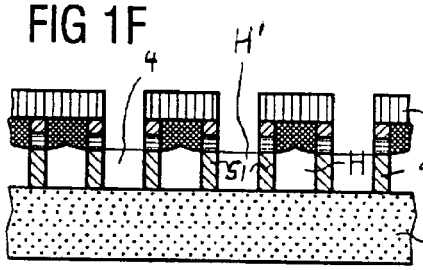
Figure 1F:
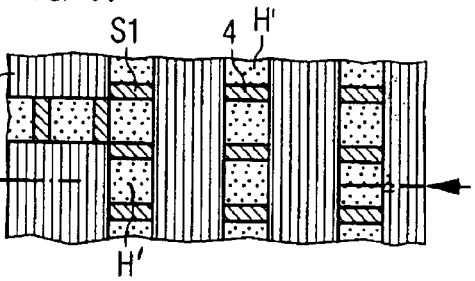
Figure 1G:
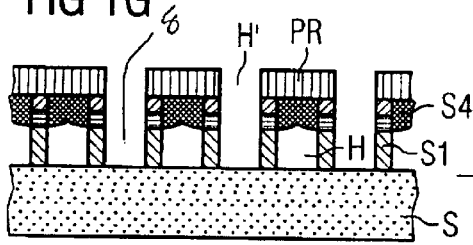
Figure 1G:
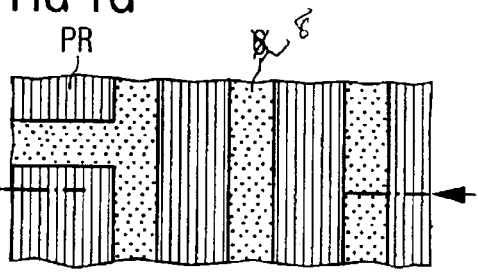

A subsequent etching process opens the covering layer S4 above the selected cavities H' and, in the process, uncovers firstly the surface of the third layer S3 and finally the surface of the first layer S1 of the partitions 4 situated between opened cavities H'. It is also possible to carry out the etching in such a way that the second layer S2 and the third layer S3 on the partitions 4 are initially not removed. As a result, even in the event of possible misalignment of the resist mask PR with respect to the side walls of the cavities H, H', it is possible to achieve opening of the cavities H' without removal of partitions. The structure thus obtained is shown in FIGS. 1F and 1F', the partitions 4 between uncovered cavities H' already having been removed down to the first layer S1 in FIG. 1F.

By means of an anisotropic plasma etching step, the residual partitions, only comprising the material of the first layer S1, between uncovered cavities H' are removed using the resist mask PR. Combining a plurality of opened cavities H' produces trenches 8 in the patterning layer 2 (see FIGS. 1G and 1G').

Figure 1H:
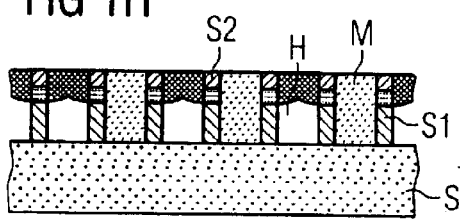
Figure 1H:
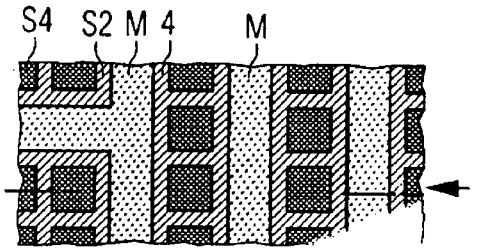

The trenches 8 and/or holes defined by the resist mask PR are then filled with the material M of the microstructures to be formed and protruding material is removed by means of a CMP step. To that end, sputtering, vapor deposition, CVD, electrochemical deposition methods or combinations thereof are used depending on the material M. The material M may be, by way of example, copper for forming interconnects. The method steps specifically required for the deposition and planarization of copper are described for example in US 2001/0002732A1. The state after the concluding CMP step with the completed microstructures M (here interconnects) is shown in FIGS. 1H and 1H'.

Figure 1I:
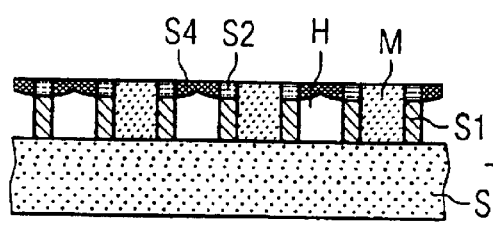
Figure 1I:
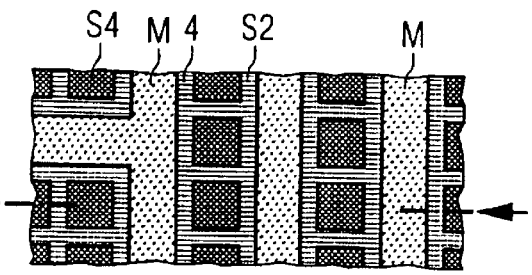

If, instead of the triple layer comprising first, second and third layers S1 to S3, only a double layer (S1 and S2) has been used or the third layer S3 has been removed again during the concluding CMP step, the result is the end state shown in FIGS. 1I and 1I'.

In the case of the exemplary embodiment described above, the microstructures produced (here interconnects) were fabricated in such a way that they are separated from one another by cavities. The low dielectric constant $\in_r=1$ of air or vacuum correspondingly reduces the dielectric constant taking effect, so that the RC time constants are reduced.

If the geometrical midpoints of the cavities (cells) are regarded as grid points and the distance between adjacent cells is designated by D and the extent of an (essentially square) cavity is designated by B, then the microstructures M have a length of n·D+B, where n is a natural number (n>0), i.e. the microstructures extend at least over two cavities. In the simplest case, the width of the microstructures corresponds to the lateral extent of a cavity. It goes without saying that the width of the microstructures may likewise extend over a plurality of cavities, so that n·D+B, where n is a natural number, holds true for the width in the case of essentially square cavities.

With reference to FIG. 2, the basic process sequence for the "cellular damascene method" is outlined for the case where the microstructures produced are not generally separated from one another by cavities.

Figure 2A:
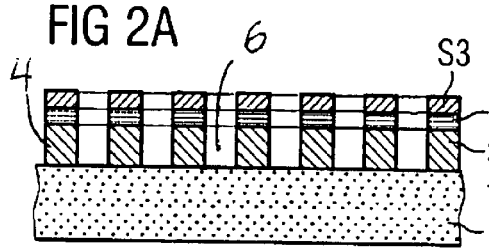
FIGS. 2A–2C' show individual fabrication steps of another exemplary embodiment of the method according to the invention.
Figure 2A:
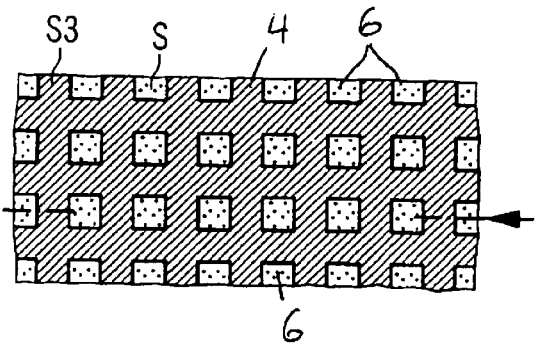

Proceeding from the layer construction shown in FIG. 1A, lithography and etching are carried out analogously to the description relating to the above illustrations of FIGS. 1B and 1B' to produce a grid pattern, as illustrated in FIGS. 2A and 2A'. In this case, however, the width of the partitions 4 has been set equal to the width of the etched depressions 6.

In the same way as in FIG. 1, FIG. 2 illustrates mutually assigned plan views and cross sections along the lines indicated by arrows in the plan views.

Figure 2B:
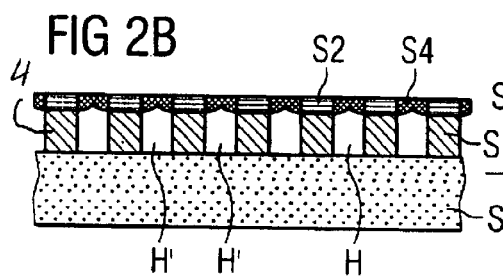
Figure 2B:
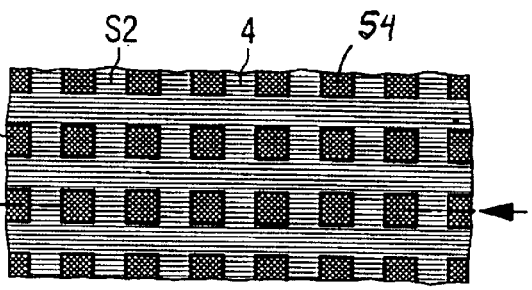

Using processes identical to those described in connection with FIG. 1, the depressions 6 are closed with the covering layer S4 and planarized, in this case the CMP step stopping on the second layer S2. The structure thus obtained is shown in FIGS. 2B and 2B'.

Figure 2C:
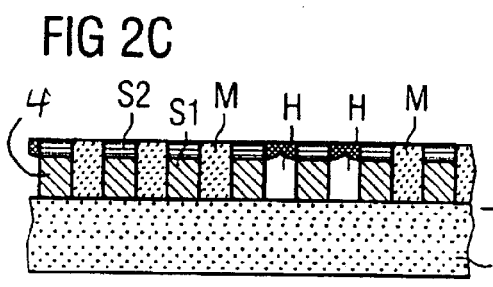
Figure 2C:
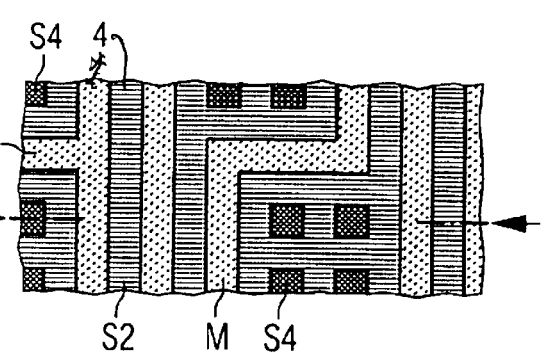

After further process steps, likewise described in connection with FIG. 1, those cavities H' in which the microstructures (here interconnects and/or contact holes) are intended to be produced are defined lithographically and opened by etching. Afterward, the uncovered partitions or webs 4 between the opened cavities (cells) H' are removed and the resulting trenches are filled with the material M of the microstructures to be fabricated. The protruding material M is removed by means of a CMP step. During the lithography for the selection of the cavities H' to be opened, account was taken of the fact that adjacent microstructures are generally closely adjacent and are separated from one another only by partitions and not additionally by cavities. Cavities between adjacent interconnects can be dispensed with particularly when the material of the first layer S1 is a "low-k dielectric". Requirements similar to those mentioned above in connection with FIGS. 1E and 1E' apply to the lithography step. However, they are more relaxed owing to the wider webs or partitions in comparison with FIG. 1. The structure obtained after the concluding planarizing step (CMP) for removing excess material M, with the completed microstructures M (here interconnects), is shown in FIGS. 2C and 2C'.

It goes without saying that the exemplary embodiments described above can readily be combined with one another.

Figure 3:
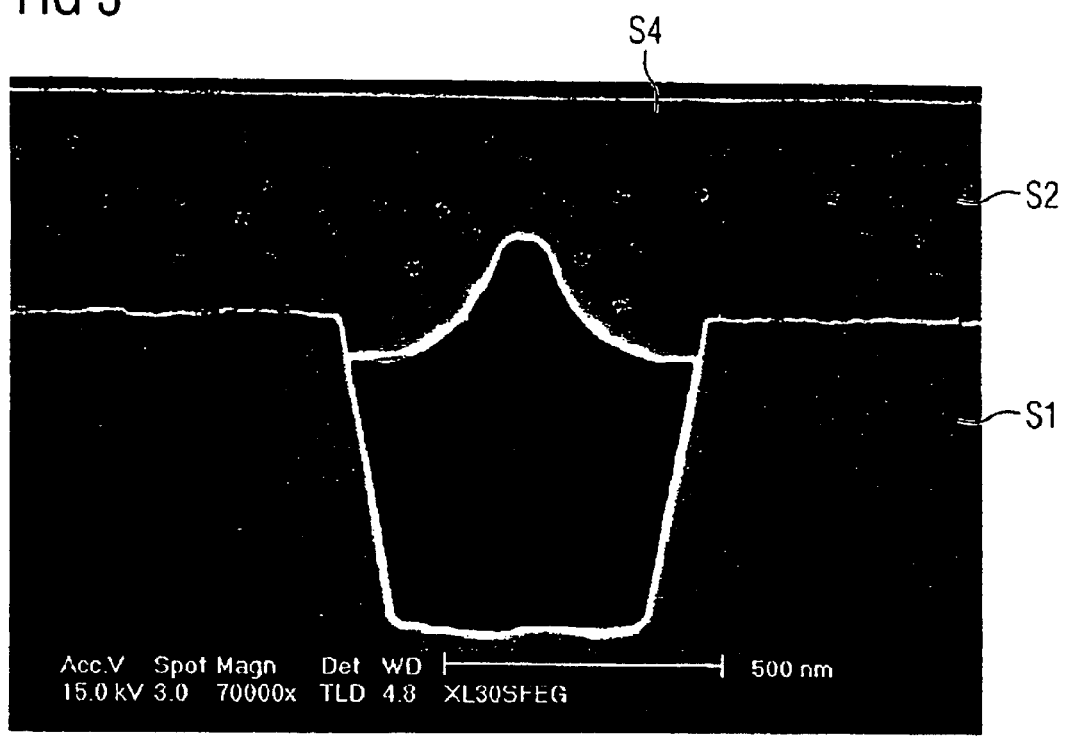
FIG. 3 is an SEM photograph of the deposition of oxide on silane PE-CVD oxide.

FIG. 3 is an SEM photograph (scanning electron microscope) of a cross-section through a cavity produced by selective ozone-enhanced TEOS deposition of the fourth layer S4 (ozone-TEOS oxide) on PE-CVD (plasma-enhanced CVD) silane oxide of the second layer S2. By contrast, no material of the fourth layer has been deposited on the first layer S1 comprising silicon nitride ($Si_3N_4$). The covering of the upper edge of the first layer S1 is caused by the ozone-TEOS oxide growing on all sides on the second layer S2.

Figure 4:
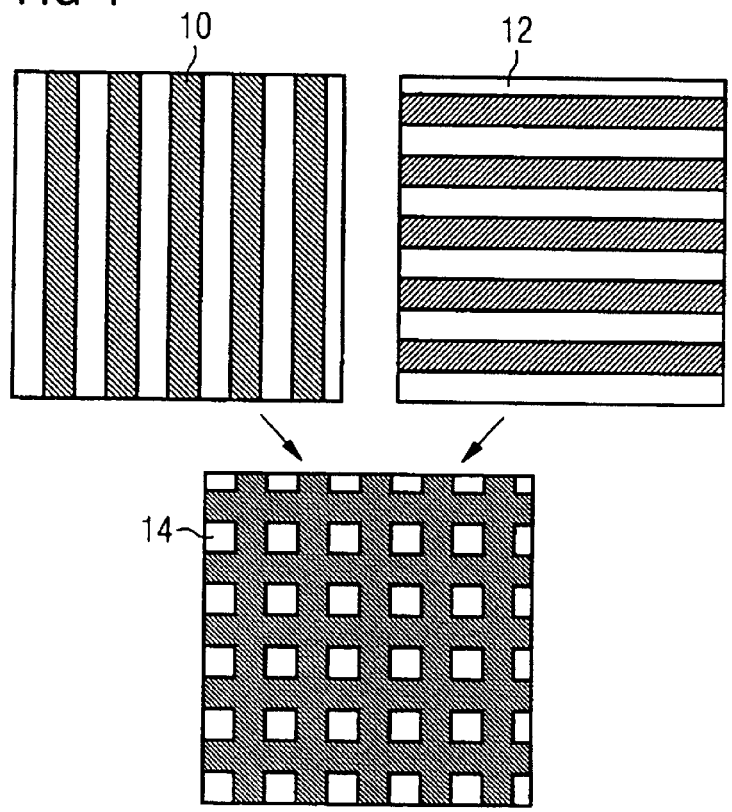
FIG. 4 shows the exposure of a resist mask with two strip patterns rotated through 90°.

FIG. 4 shows two identical strip patterns 10 and 12 rotated through 90°, which are successively imaged into the resist mask 14 used for defining the depressions or cavities.

Although various minor modifications may be suggested by those versed in the art, it should be understood that we wish to embody within the scope of the patent granted hereon all such modifications as reasonably and properly come within the scope of our contribution to the art.

We claim:

1. A method for fabricating microstructures, said method having the following steps: providing a substrate having a patterning layer, forming a regular arrangement of closed cavities in the patterning layer with adjacent cavities being separated from one another by partitions, opening selected cavities in which microstructures are intended to be produced; removing at least a portion of the partitions situated between adjacent opened cavities in order to form trenches extending over at least two cavities; and introducing a material into the trenches in order to fabricate the microstructures.

2. A method according to claim 1, wherein the step of forming closed cavities includes forming depressions in the patterning layer, and then closing the depressions with a covering layer to produce the closed cavities.

3. A method according to claim 2, wherein the step of providing the patterning layer includes successively applying at least a first and second layer of material on a substrate, the materials of the first and second layers being chosen so as to enable a depositing of a material of a covering layer on the second layer selectively with respect to the first layer to form the closed cavities, the depressions being formed in the first and second layer, the depressions penetrating through the second layer completely and penetrating through the first layer at least partially and, afterwards, the material of the covering layer being deposited in such a way that it grows essentially only on the second layer.

4. A method according to claim 3, wherein the step of forming the patterning layer includes applying a third layer onto the second layer, the material of said third layer being different than the second layer, so that the material of the covering layer essentially grows only on the second layer.

5. A method according to claim 3, wherein the material of the covering layer is polished back as far as the outermost layer, with the outermost layer acting as a polishing stop.

6. A method according to claim 3, wherein a third layer is applied onto the second layer and the first, second and third layers are dielectric layers.

7. A method according to claim 6, wherein the material of the first and third layers is a silicon nitride and the material of the second layer is a silane-based silicon oxide deposited in a plasma-enhanced fashion and the material of the covering layer is an oxide fabricated by means of a $O_3$/TEOS deposition.

8. A method according to claim 3, wherein the first layer is about four to five times thicker than the second layer.

9. A method according to claim 1, wherein the step of forming the closed cavities includes providing a lithographic pattern and subsequently etching cavities into the patterned layer.

10. A method according to claim 9, wherein the step of forming a lithographic pattern includes forming a resist mask utilizing two regular strip patterns rotated through a predetermined angle relative to one another and being successively imaged into said resist mask.

11. A method according to claim 10, wherein the predetermined angle is 90°.

12. A method according to claim 1, wherein, in addition to forming trenches, individually opened cavities are also formed and said step of producing materials includes introducing materials into the trenches and the individually opened cavities to form said microstructure.

13. A method according to claim 1, wherein the step of opening the cavities in order to remove the partitions includes providing a mask to the covering layer.

14. A method according to claim 1, wherein the material of the microstructure to be formed is introduced into the opened cavities and protruding material is polished back.

15. A method according to claim 1, wherein the material of the microstructures to be formed is selected from a group consisting of metal, metal alloys and copper.

16. A method according to claim 1, wherein the microstructures to be fabricated are interconnects.

* * * * *